United States Patent
Kim et al.

(10) Patent No.: US 9,024,898 B2
(45) Date of Patent: May 5, 2015

(54) TOUCH PANEL AND METHOD FOR MANUFACTURING THE SAME

(71) Applicant: Samsung Electro-Mechanics Co., Ltd., Suwon (KR)

(72) Inventors: Jae Hun Kim, Suwon (KR); Sang Su Hong, Suwon (KR); Jin Uk Lee, Suwon (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 254 days.

(21) Appl. No.: 13/778,326

(22) Filed: Feb. 27, 2013

(65) Prior Publication Data

US 2014/0184525 A1 Jul. 3, 2014

(30) Foreign Application Priority Data

Dec. 27, 2012 (KR) .......................... 10-2012-0154658

(51) Int. Cl.
| | | |
|---|---|---|
| *G06F 3/041* | (2006.01) | |
| *H05K 3/00* | (2006.01) | |
| *G06F 3/044* | (2006.01) | |
| *H05K 3/10* | (2006.01) | |

(52) U.S. Cl.
CPC ................ *H05K 3/007* (2013.01); *G06F 3/044* (2013.01); *G06F 2203/04103* (2013.01); *H05K 3/106* (2013.01); *H05K 2201/0108* (2013.01); *H05K 2201/10128* (2013.01); *H05K 2203/0514* (2013.01); *H05K 2203/125* (2013.01)

(58) Field of Classification Search
CPC . G06F 3/041; G06F 3/044; G06F 2203/0411; H05K 3/007; H05K 3/106
See application file for complete search history.

(56) References Cited

U.S. PATENT DOCUMENTS

| | | | | |
|---|---|---|---|---|
| 2011/0289771 | A1* | 12/2011 | Kuriki | 29/829 |
| 2012/0255762 | A1* | 10/2012 | Katagiri et al. | 174/126.1 |
| 2013/0161178 | A1* | 6/2013 | Kim et al. | 200/600 |
| 2013/0162545 | A1* | 6/2013 | Kim et al. | 345/173 |
| 2013/0162547 | A1* | 6/2013 | Yoo et al. | 345/173 |
| 2014/0016290 | A1* | 1/2014 | Lee et al. | 361/792 |
| 2014/0062905 | A1* | 3/2014 | Lee et al. | 345/173 |
| 2014/0078111 | A1* | 3/2014 | Lee et al. | 345/176 |
| 2014/0176823 | A1* | 6/2014 | Jeon et al. | 349/12 |

FOREIGN PATENT DOCUMENTS

KR 1020100134226 12/2010

* cited by examiner

*Primary Examiner* — Joe H Cheng
(74) *Attorney, Agent, or Firm* — Ladas & Parry, LLP

(57) ABSTRACT

Disclosed herein is a touch panel, including: a first transparent substrate; a bezel portion formed on one surface of the first transparent substrate; and an electrode portion formed on the other surface of the first transparent substrate, wherein the bezel portion and the electrode portion are formed by exposing/developing a silver salt emulsion layer.

20 Claims, 6 Drawing Sheets

TOUCH PANEL AND METHOD FOR MANUFACTURING THE SAME

CROSS REFERENCE TO RELATED APPLICATION

This application claims the benefit of Korean Patent Application No. 10-2012-0154658, filed on Dec. 27, 2012, entitled "Touch Panel And Method Of Manufacturing The Same" which is hereby incorporated by reference in its entirety into this application.

BACKGROUND OF THE INVENTION

1. Technical Field

The present invention relates to a touch panel and a method of manufacturing the same.

2. Description of the Related Art

In accordance with the growth of computers using a digital technology, devices assisting computers have also been developed, and personal computers, portable transmitters and other personal information processors execute processing of text and graphics using a variety of input devices such as a keyboard and a mouse.

While the rapid advancement of an information-oriented society has widened the use of computers more and more, it is difficult to efficiently operate products using only a keyboard and a mouse currently serving as an input device. Therefore, the necessity for a device that is simple, has minimum malfunction, and is capable of easily inputting information has increased.

In addition, current techniques for input devices have progressed toward techniques related to high reliability, durability, innovation, designing and processing beyond the level of satisfying general functions. To this end, a touch panel has been developed as an input device capable of inputting information such as text, graphics, or the like.

This touch panel is mounted on a display surface of an image display device such as an electronic organizer, a flat panel display device including a liquid crystal display (LCD) device, a plasma display panel (PDP), an electroluminescence (El) element, or the like, and a cathode ray tube (CRT) to thereby be used to allow users to select desired information while viewing the image display device.

In addition, the touch panel is classified into a resistive type touch panel, a capacitive type touch panel, an electromagnetic type touch panel, a surface acoustic wave (SAW) type touch panel, and an infrared type touch panel. These various types of touch panels are adapted for electronic products in consideration of a signal amplification problem, a resolution difference, a level of difficulty of designing and processing technologies, optical characteristics, electrical characteristics, mechanical characteristics, resistance to an environment, input characteristics, durability, and economic efficiency. Currently, the resistive type touch panel and the capacitive type touch panel have been prominently used in a wide range of fields.

Generally, in the touch panel, a bezel portion having black or white, and the like, that covers an electrode wiring or may be formed with ornament patterns is formed on a window glass that is disposed at an outermost side of a touch panel structure.

A detailed example of the touch panel of the prior art that is formed with the bezel portion may include a touch panel disclosed in Korean Patent Laid-Open Publication No. 2010-0134226.

However, the touch panel of the prior art has a problem of non-uniformity of printing due to a difference in viscosities for each ink at the time of printing the bezel portion for forming the bezel portion on the window glass, a change in ink viscosity, and the like.

PRIOR ART DOCUMENT

Patent Document (Patent Document 1) Korean Patent Laid-Open Publication No. 2010-0134226

SUMMARY OF THE INVENTION

The present invention has been made in an effort to provide a touch panel uniformly formed with a bezel portion and a method for manufacturing the same.

According to a preferred embodiment of the present invention, there is provided a touch panel including: a first transparent substrate; a bezel portion formed on one surface of the first transparent substrate; and an electrode portion formed on the other surface of the first transparent substrate, wherein the bezel portion and the electrode portion are formed by exposing/developing a silver salt emulsion layer.

The first transparent substrate may be formed of glass or film.

The first transparent substrate may be partitioned into an active region and an inactive region that is an edge of the active region and the bezel portion may be formed in the inactive region on one surface of the first transparent substrate.

The first electrode portion may include: a first electrode formed in the active region on the other surface of the first transparent substrate; and a first electrode wiring formed in the inactive region on the other surface of the first transparent substrate so as to be connected with the electrode.

A silver salt included in the silver salt emulsion layer may be an inorganic silver salt or an organic silver salt.

The touch panel may further include: a second transparent substrate disposed in the other surface direction of the first transparent substrate; and a second electrode portion formed on one surface or the other surface of the second transparent substrate.

The touch panel may further include: an insulating layer formed between the first transparent substrate and the second transparent substrate.

The second transparent substrate may be partitioned into an active region and an inactive region that is an edge of the active region, and the second electrode portion may include: a second electrode formed in the active region on one surface or the other surface of the second transparent substrate; and a second electrode wiring formed in the inactive region on one surface or the other surface of the second transparent substrate so as to be connected with the electrode.

According to another preferred embodiment of the present invention, there is provided a method for manufacturing a touch panel, including: (a) applying a silver salt emulsion layer on both surfaces of a first transparent substrate; and (b) exposing/developing the silver salt emulsion layer to form a bezel portion on one surface of the first transparent substrate and form a first electrode portion on the other surface thereof.

In the step (b), the first transparent substrate may be partitioned into an active region and an inactive region that is an edge of the active region to form the bezel portion in the inactive region on one surface of the first transparent substrate.

In the step (b), the first electrode portion may include a first electrode and a first electrode wiring to form the first electrode in the active region on the other surface of the first transparent substrate and form the first electrode wiring in the inactive region so as to be connected with the first electrode.

In the step (b), the bezel portion and the first electrode portion may be formed simultaneously.

The step (a) may include applying the silver salt emulsion layer on one surface or the other surface of the second transparent substrate.

The step (b) may include exposing/developing the sliver salt emulsion layer to form a second electrode portion on one surface or the other surface of the second transparent substrate.

In the step (b), the bezel portion and the first and second electrode portions may be formed simultaneously.

The first and second transparent substrates may be formed of glass or film.

A silver salt included in the silver salt emulsion layer may be an inorganic silver salt or an organic silver salt.

In the step (b), the second electrode portion may include a second electrode and a second electrode wiring and the second transparent substrate may be partitioned into an active region and an inactive region that is an edge of the active region to form the second electrode in the active region on one surface or the other surface of the second transparent substrate and form the second electrode wiring in the inactive region so as to be connected with the second electrode.

According to still another preferred embodiment of the present invention, there is provided a touch panel, including: a transparent substrate that is partitioned into an active region and an inactive region that is an edge of the active region; a bezel portion formed in the inactive region on one surface of the transparent substrate; and an electrode portion that is formed in the inactive region on one surface of the bezel portion and one surface of the transparent substrate, wherein the bezel portion and the electrode portion are formed by exposing/developing a silver salt emulsion layer.

The touch panel may further include: an overcoat layer disposed between the bezel portion and the electrode portion to cover the bezel portion.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
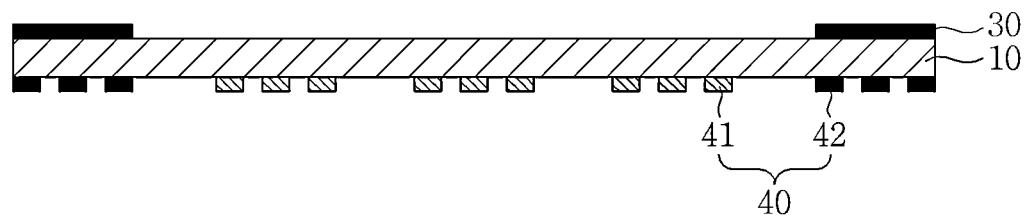
FIG. 1 is a cross-sectional view illustrating a touch panel according to a preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first," "second," "one side," "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention are described in detail with reference to the accompanying drawings.

Figure 2:
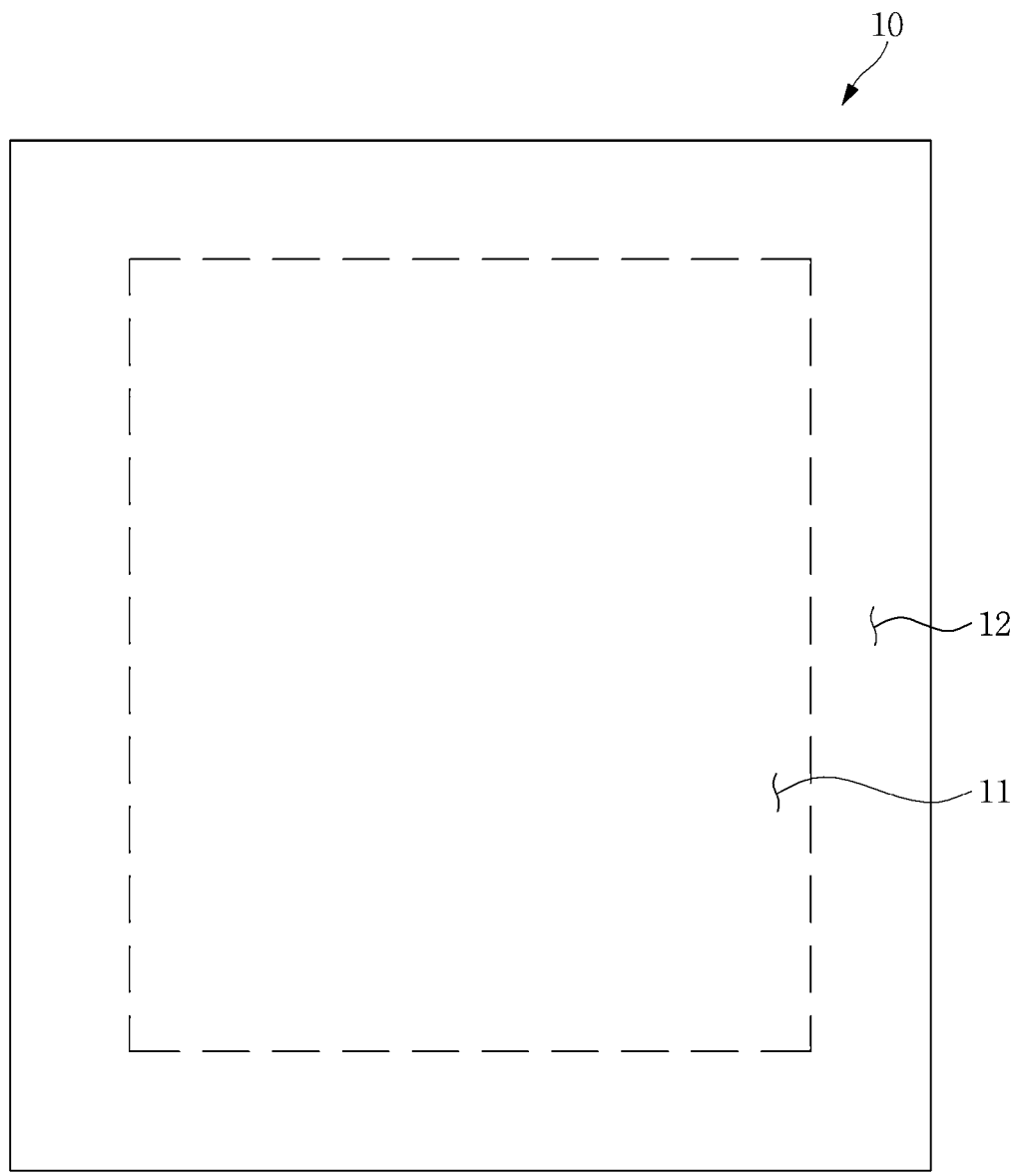
FIG. 2 is a plan view illustrating a transparent substrate in the touch panel according to the preferred embodiment of the present invention.

FIG. 1 is a cross-sectional view illustrating a touch panel according to a preferred embodiment of the present invention and FIG. 2 is a plan view illustrating a transparent substrate in the touch panel according to the preferred embodiment of the present invention.

As illustrated in FIGS. 1 and 2, the touch panel according to the preferred embodiment of the present invention includes a first transparent substrate 10 that is partitioned into an active region 11 and an inactive region 12 that is an edge of the active region 11 and a bezel portion 30 formed in the inactive region 12 on one surface of the first transparent substrate 10.

First, the first transparent substrate 10 may serve to provide a region in which a first electrode portion 40 for detecting touched positions is formed. The first transparent substrate 10 needs to have a support force capable of supporting the electrode portion 40, the electrode wiring 40, and the like, and transparency to allow a user to recognize images provided from an image display device.

In consideration of the support force and the transparency described above, the first transparent substrate 10 may be made of polyethylene terephthalate (PET), polycarbonate (PC), poly methyl methacrylate (PMMA), polyethylene naphthalate (PEN), polyethersulpon (PES), a cyclic olefin polymer (COC), a triacetylcellulose (TAC) film, a polyvinyl alcohol (PVA) film, a polyimide (PI) film, polystyrene (PS), biaxially oriented polystyrene (BOPS; containing K resin), glass, or tempered glass, but are not necessarily limited thereto.

Meanwhile, as illustrated in FIG. 2, the first transparent substrate 10 may be partitioned into the active region 11 and the inactive region 12 that is an edge region of the active region 11. The active region 11 is a region that is touched by a user and a screen region in which a user visually identifies an operating scene of a device. Further, the inactive region 12 is covered by the bezel portion 30 to be described below that is formed on the first transparent substrate 10, and thus is a region that is not exposed to the outside.

As illustrated in FIGS. 1 and 2, the bezel portion 30 is formed in the inactive region 12 on one surface of the first transparent substrate 10. The bezel portion 30 may serve to cover a first electrode wiring 42 that is disposed in a region corresponding to the inactive region 12 of the first transparent substrate 10. Further, the bezel portion 30 may be formed with an ornament pattern such as logos of makers, if necessary.

Further, the bezel portion 30 may be formed by exposing and developing a silver salt emulsion layer 20.

Herein, the silver salt emulsion layer 20 includes a silver salt and a binder and may further include additives such as a solvent, a dye, and the like.

In addition, an example of the silver salt may include an inorganic silver salt such as silver halide, and the like, or an organic silver salt such as acetate silver.

An example of the binder may include gelatin, polyvinyl alcohol (PVA), polyvinyl pyrrolidone (PVP), polysaccharides, such as starch, cellulose and derivatives thereof, polyethylene oxide, polyvinylamine, chitosan, poly-lysine, poly-acrylic acid, poly-alginic acid, poly hyaluronic acid, carboxycellulose, and the like.

The solvent is not particularly limited, but may include, for example, water, organic solvents (for example, alcohols such as methanol, ketones such as acetone, amids such as formamid, sulfoxides such as dimethyl sulfoxide, esters such as acetic acid ethyl, ethers, and the like), an ionic liquid, and a mixed solvent thereof.

In addition, additives are not particularly limited, but known additives may be preferably used.

The bezel portion 30 formed by exposing and developing the silver salt emulsion layer 20 generally has a dark color as silver particles generated by exposing and developing the silver salt emulsion layer 20 have a black color or a dark color approximating a black color. Therefore, the silver salt emulsion layer 20 may serve as a color ink layer that is formed as the bezel portion 30 of the touch panel according to the related art.

The first electrode portion 40 may be formed on the other surface of the first transparent substrate 10. In this case, the first electrode portion 40 may be configured of the first electrode 41 that is formed in the active region 11 on the other surface of the first transparent substrate 10 and the first electrode wiring 42 that is formed in the inactive region 12 and connected with the edge of the first electrode 41.

Herein, the first electrode 41 and the first electrode wiring 42 may be formed of the same material as the bezel portion 30. Therefore, the bezel portion 30, the first electrode 41, and the first electrode wiring 42 may be formed simultaneously, thereby simplifying the manufacturing process and shortening the manufacturing time.

Meanwhile, the first electrode 41 may be formed in a mesh pattern. In this case, the first electrode 41 may have, for example, a line width of 7 μm or less and a pitch of 900 μm or less, such that visibility may be improved so as to prevent the patterns from being visible. However, the line width and the pitch of the first electrode 41 according to the preferred embodiment of the present invention are not necessarily limited thereto.

The touch panel according to the preferred embodiment of the present invention may have a window glass (not illustrated) disposed at the outermost side thereof. In this case, the window glass may be disposed on one surface of the first transparent substrate 10. Herein, the window glass may be bonded to one surface of the first transparent substrate 10 on which the bezel portion 30 is formed, by an adhesive, but the present invention is not necessarily limited thereto.

Figure 3:
FIGS. 3 to 5 are cross-sectional views illustrating a process sequence of a method for manufacturing a touch panel according to the preferred embodiment of the present invention.
Figure 4:
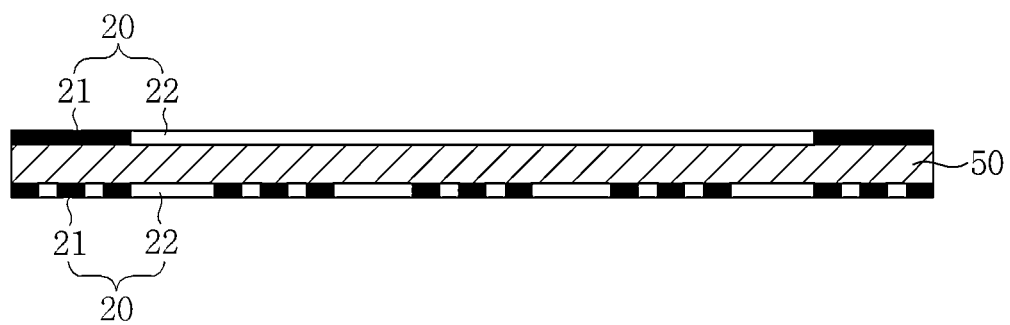
Figure 5:
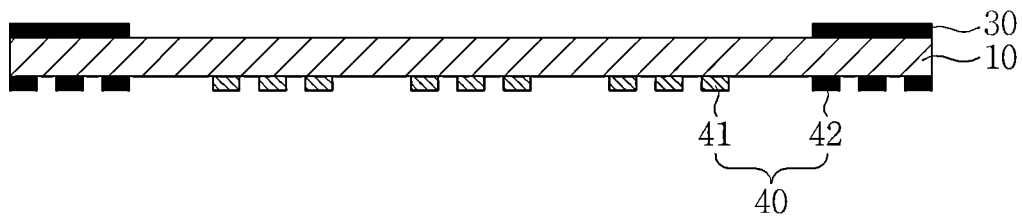

A method for manufacturing a touch panel according to a preferred embodiment of the present invention will be described with reference to the accompanying drawings. FIGS. 3 to 5 are cross-sectional views illustrating a process sequence of a method for manufacturing a touch panel according to the preferred embodiment of the present invention.

Referring to FIG. 3, the method for manufacturing a touch panel according to the preferred embodiment of the present invention includes (a) preparing a first transparent substrate 10 and applying a silver salt emulsion layer 20 on both surfaces of the first transparent substrate 10 and (b) forming the bezel portion 30 in the inactive region 12 on one surface of the first transparent substrate 10 and forming the first electrode portion 40 on the other surface thereof, by exposing/developing the silver salt emulsion layer 20.

Referring to FIG. 4, in the step (a), the first transparent substrate 10 is prepared and the silver salt emulsion layer 20 is applied on both surfaces of the first transparent substrate 10.

The first transparent substrate 10 may be formed of the foregoing materials having transparency. The first transparent substrate 10 may be partitioned into the active region 11 and the inactive region 12 (see FIG. 2).

The silver salt emulsion layer 20 includes a silver salt and a binder and may further include additives such as a solvent, a dye, and the like. An example of the silver salt may include an inorganic silver salt such as silver halide, and the like, or an organic silver salt such as acetate silver.

Figure 6:
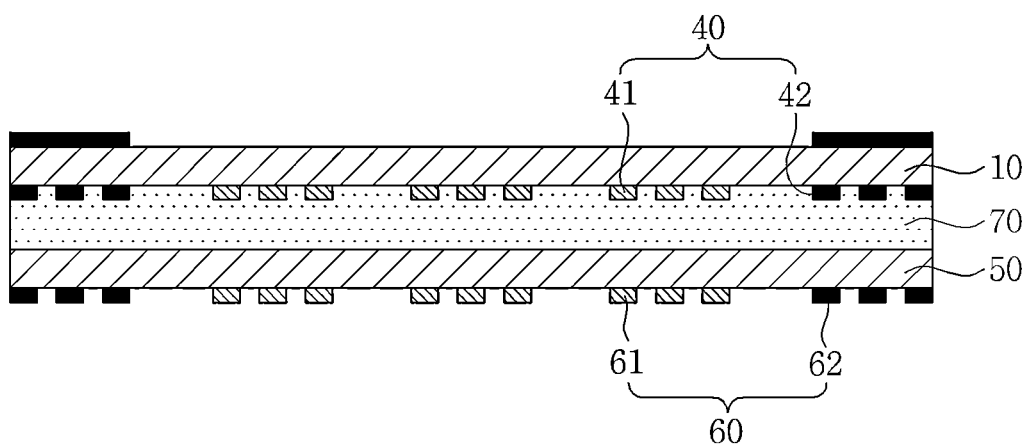
FIG. 6 is a cross-sectional view illustrating a touch panel according to another preferred embodiment of the present invention.

Referring to FIGS. 5 and 6, in the step (b), the bezel portion 30 and the first electrode portion 40 are formed by exposing and developing the silver salt emulsion layer 20.

As the detailed method for exposing the silver salt emulsion layer 20, a surface exposing method using a photomask, a scanning exposure method using a laser beam, and the like, may be used. Alternatively, various methods, such as a refractive exposure using a lens, a reflective exposure using a reflector, a contact exposure, a proximity exposure, a reduction projection exposure, a reflective projection exposure, may be used.

The developing processing is additionally performed after the silver salt emulsion layer 20 is exposed as described above. For the developing processing, a general developing processing technology used for a silver salt photographic film or photographic paper, a film for a printing plate, an emulsion mask for a photomask, and the like may be used.

In more detail, when the silver salt emulsion layer 20 is selectively exposed using, for example, a photomask, as illustrated in FIG. 4, a cured portion 21 is selectively formed by selectively curing a portion to which light is irradiated. In this case, when a non-cured portion 22 that is not cured is removed by a remover, as illustrated in FIG. 5, only the cured portion 21 remains on the first transparent substrate 10, such that the bezel portion 30 and the first electrode portion 40 may be formed.

However, the present invention is not limited thereto, and therefore, as another example, at the time of performing the exposure using the photomask 20, only the portion to which light is not irradiated is cured, such that the bezel portion 30 and the first electrode portion 40 may be formed. As another example, the preferred embodiment of the present invention exposes and cures the portion at which the bezel portion 30 and the first electrode portion 40 are formed, in the silver salt emulsion layer 20 by using the photomask and may conduct current only to a portion at which the first electrode portion 40 is formed, in the portion cured by fixatives. In this case, the non-cured portion may not be removed.

Meanwhile, the bezel portion 30 formed by exposing and developing the silver salt emulsion layer 20 is formed in the non-active region 12 on one surface of the first transparent substrate 10 and the first electrode portion 40 is formed on the other surface of the first transparent substrate 10. In this case, the first electrode portion 40 may include the first electrode 41 that is formed in the active region 11 on the other surface of the first transparent substrate 10 and the first electrode wiring 42 that is formed in the inactive region 12. In this case, the first electrode wiring 42 may be connected with an edge of the first electrode 41 to receive an electrical signal from the first electrode 41.

In this case, the window glass may be disposed at the outermost side of the touch panel. In this case, the window glass may be bonded to one surface of the first transparent substrate 10 by an adhesive, but the method for bonding the window glass of the present invention to the first transparent substrate 10 is not necessarily limited thereto.

Figure 7:
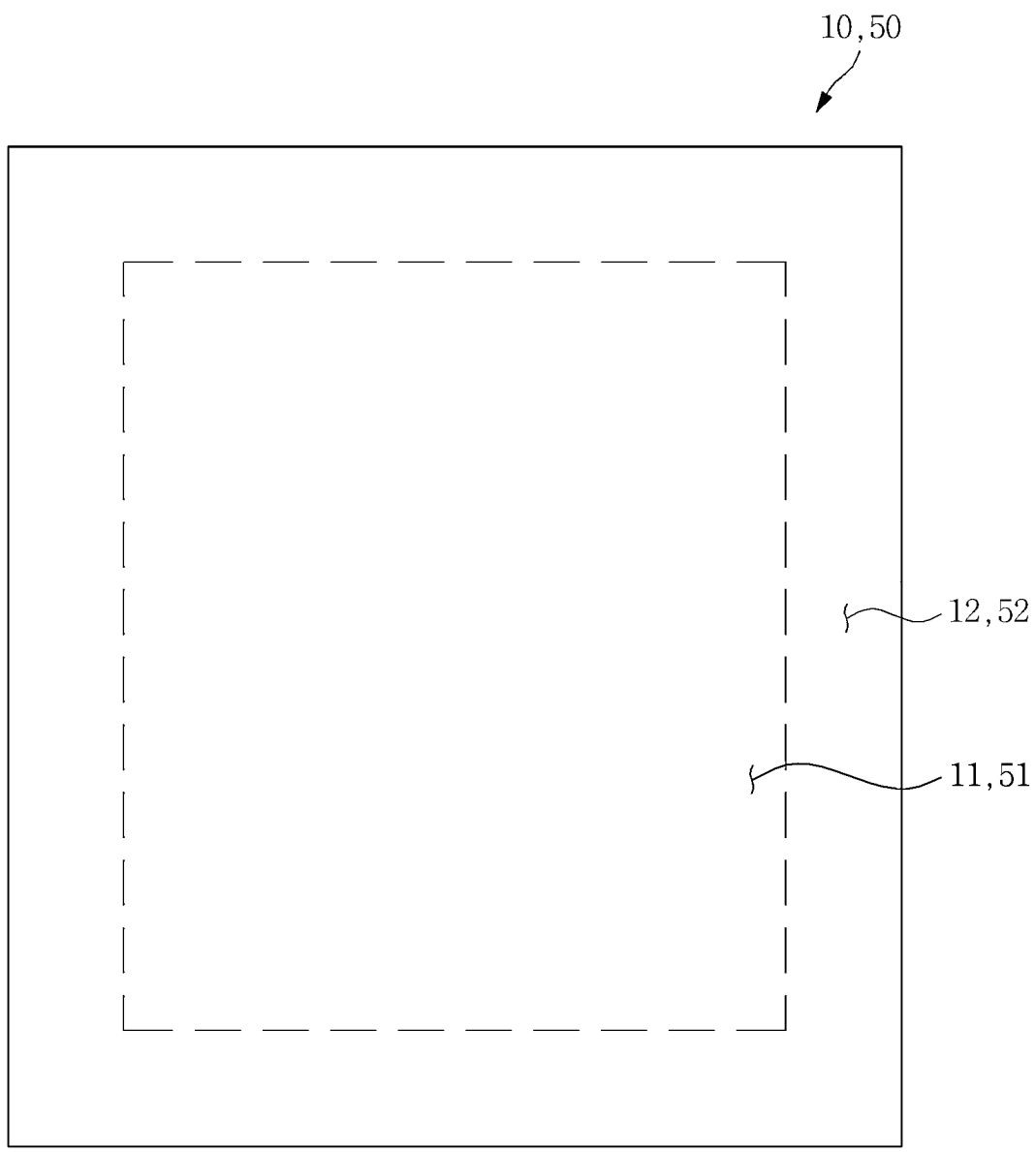
FIG. 7 is a plan view illustrating a transparent substrate in the touch panel according to another preferred embodiment of the present invention.

FIG. 6 is a cross-sectional view illustrating a touch panel according to another preferred embodiment of the present invention and FIG. 7 is a plan view illustrating a transparent substrate in the touch panel according to another preferred embodiment of the present invention.

As illustrated in FIGS. 6 and 7, the touch panel according to another preferred embodiment of the present invention includes the first transparent substrate 10 and the second transparent substrate 50 that are partitioned into the active region 11 and the inactive regions 12 and 52 that are an edge of the active region 11 and the bezel portion 30 formed in the inactive regions 12 and 52 on one surface of the first transparent substrate 10.

First, the first and second transparent substrates 10 and 50 may be made of polyethylene terephthalate (PET), polycarbonate (PC), poly methyl methacrylate (PMMA), polyethylene naphthalate (PEN), polyethersulpon (PES), a cyclic olefin polymer (COC), a triacetylcellulose (TAC) film, a polyvinyl alcohol (PVA) film, a polyimide (PI) film, polystyrene (PS), biaxially oriented polystyrene (BOPS; containing K resin), glass, or tempered glass, but are not necessarily limited thereto.

Meanwhile, as illustrated in FIG. 7, the first and second transparent substrates 10 and 50 may be partitioned into the active regions 11 and 51 and the inactive regions 12 and 52 that are the edge regions of the active regions 11 and 51. The active region 11 and 51 are a region that is touched by a user and a screen region in which a user visually identifies an operating scene of a device. Further, the inactive region 12 and 52 are covered by the bezel portion 30 to be described below that is formed on the first transparent substrate 10, and thus is a region that is not exposed to the outside.

As illustrated in FIGS. 6 and 7, the bezel portion 30 is formed in the inactive regions 12 and 52 on one surface of the first transparent substrate 10. The bezel portion 30 may serve to cover a first electrode wiring 42 and a second electrode wiring 62 that are disposed in a region corresponding to the inactive regions 12 and 52 of the first and second transparent substrates 10 and 50. Further, the bezel portion 30 may be formed with an ornament pattern such as logos of makers, if necessary.

The bezel portion 30 included in the touch panel according to another preferred embodiment of the present invention is formed by exposing and developing the silver salt emulsion layer 20.

The silver salt emulsion layer 20 includes a silver salt and a binder and may further include additives such as a solvent, a dye, and the like.

An example of the silver salt may include an inorganic silver salt such as silver halide, and the like, or an organic silver salt such as acetate silver.

The bezel portion 30 formed by exposing and developing the silver salt emulsion layer 20 generally has a dark color as silver particles generated by exposing and developing the silver salt emulsion layer 20 have a black color or a dark color approximating a black color. Therefore, the silver salt emulsion layer 20 may serve as a color ink layer that is formed as the bezel portion 30 of the touch panel according to the prior art.

The first and second electrode portions 40 and 60 may be formed on the other surface of the first transparent substrate 10. In this case, the first and second electrode portions 40 and 60 may be configured to include the first electrode 41 and the second electrode 61 that are formed in the active regions 11 and 51 on the other surfaces of the first and second transparent substrates 10 and 50 and the first and second electrode wirings 42 and 62 that are formed in the inactive regions 12 and 52 so as to be connected with the edge of the first electrode 41.

Herein, the first and second electrodes 41 and 61 and the first and second electrode wirings 42 and 62 may be formed of the same material as the bezel portion 30. Therefore, the bezel portion 30, the first and second electrodes 41 and 61, and the first and second electrode wirings 42 and 62 may be formed simultaneously, thereby simplifying the manufacturing process and shortening the manufacturing time.

Meanwhile, the first and second electrodes 41 and 61 may be formed in a mesh pattern. In this case, the first and second electrodes 41 and 61 may have, for example, a line width of 7 μm or less and a pitch of 900 μm or less, such that the visibility may be improved so as to prevent the patterns from being visible. However, the line widths and the pitches of the first and second electrode 41 and 61 according to another preferred embodiment of the present invention are not necessarily limited thereto.

Meanwhile, the touch panel according to another preferred embodiment of the present invention may further include an insulating layer 70 that is formed between the first transparent substrate 10 and the second transparent substrate 50.

Herein, the insulating layer 70 may be formed of epoxy or acrylic based resin, a SiOx thin film, a SiNx thin film, and the like, by printing, chemical vapor deposition (CVD), sputtering, and the like.

The touch panel according to another preferred embodiment of the present invention may have a window glass (not illustrated) disposed at the outermost side thereof. In this case, the window glass may be disposed on one surface of the first transparent substrate 10. Herein, the window glass may be bonded to one surface of the first transparent substrate 10 on which the bezel portion 30 is formed, by an adhesive, but the present invention is not necessarily limited thereto.

The method for manufacturing a touch panel according to another preferred embodiment of the present invention will be described with reference to the accompanying drawings. FIGS. 8 to 11 are cross-sectional views illustrating a process sequence of a method for manufacturing a touch panel according to another preferred embodiment of the present invention.

Referring to FIGS. 8 to 11, the method for manufacturing a touch panel according to another preferred embodiment of the present invention includes (a) preparing the first and second transparent substrates 10 and 50 and applying the silver salt emulsion layer 20 on both surfaces of the first transparent substrate 10 and one surface or the other surface of the second transparent substrate 50 and (b) exposing/developing the silver salt emulsion layer 20 to form the bezel portion 30 in the inactive regions 12 and 52 on one surface of the first transparent substrate 10 and the first electrode portion 40 on the other surface thereof and forming the second electrode portion on one surface or the other surface of the second transparent substrate 50.

Figure 8:
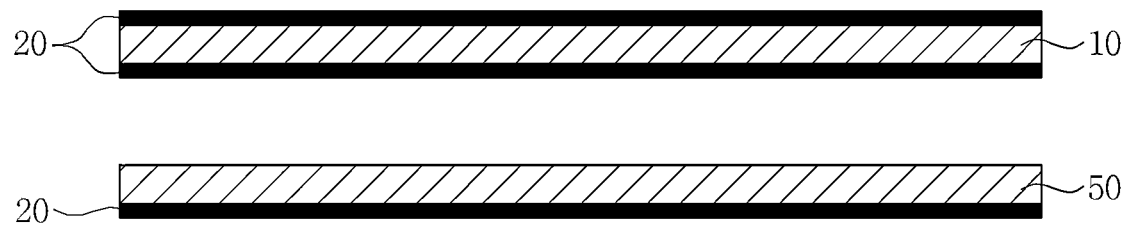
FIGS. 8 to 11 are cross-sectional views illustrating a process sequence of a method for manufacturing a touch panel according to another preferred embodiment of the present invention.

Referring to FIG. 8, in the step (a) the first and second transparent substrates 10 and 50 are prepared and the silver salt emulsion layer 20 is applied on both surfaces of the first transparent substrate 10 and on one surface or the other surface of the second transparent substrate 50.

The first and second transparent substrates 10 and 50 may be formed of the foregoing materials having transparency. The first transparent substrate 10 may be partitioned into the active regions 11 and 51 and the inactive regions 12 and 52 (see FIG. 7).

The silver salt emulsion layer 20 includes a silver salt and a binder and may further include additives such as a solvent, a dye, and the like. An example of the silver salt may include an inorganic silver salt such as silver halide, and the like, or an organic silver salt such as acetate silver.

Figure 9:
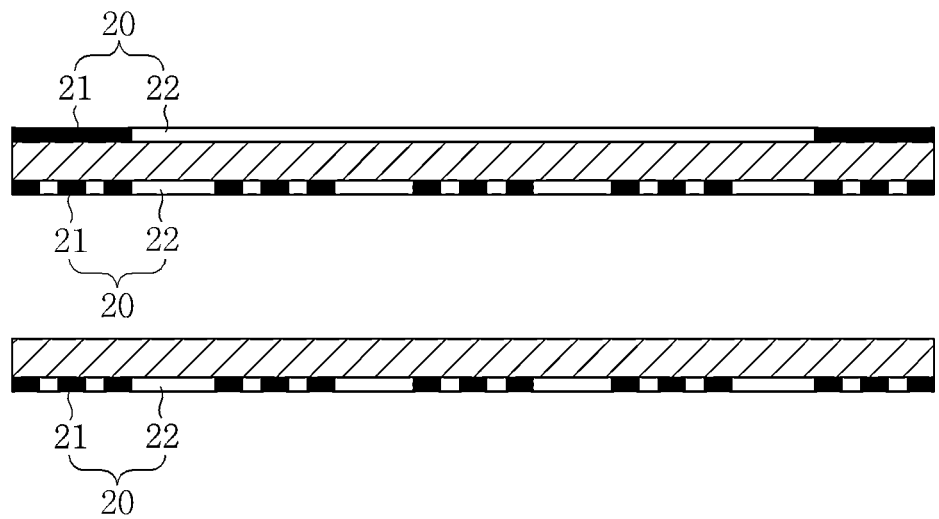
Figure 10:
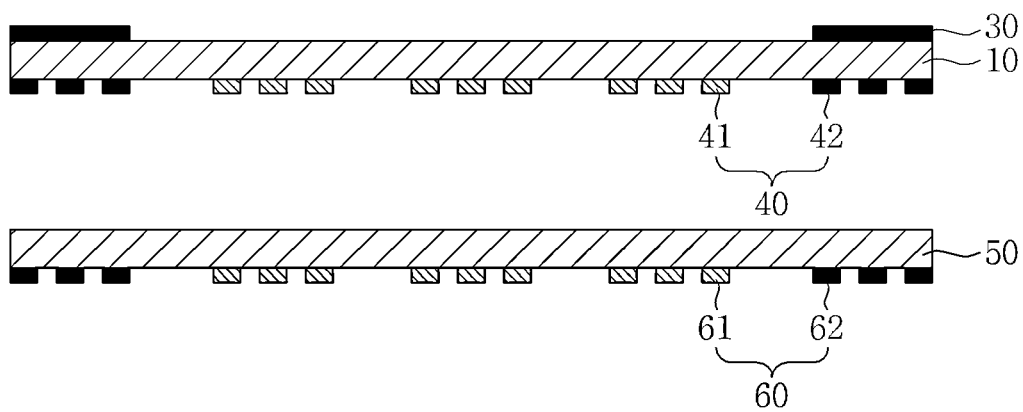

Referring to FIGS. 9 and 10, in the step (b), the bezel portion 30 and the first and second electrode portions 40 and 60 are formed by exposing and developing the silver salt emulsion layer 20.

As the detailed method for exposing the silver salt emulsion layer 20, a surface exposing method using a photomask, a scanning exposure method using a laser beam, and the like, may be used. Alternatively, various methods, such as a refractive exposure using a lens, a reflective exposure using a reflector, a contact exposure, a proximity exposure, a reduction projection exposure, a reflective projection exposure, may be used.

The developing processing is additionally performed after the silver salt emulsion layer 20 is exposed as described above. For the developing processing, a general developing processing technology used for a silver salt photographic film or photographic paper, a film for a printing plate, an emulsion mask for a photomask, and the like may be used.

In more detail, when the silver salt emulsion layer 20 is selectively exposed using, for example, a photomask, as illustrated in FIG. 9, the cured portion 21 is selectively formed by selectively curing a portion to which light is irradiated. In this case, when the non-cured portion 22 that is not cured is removed by a remover, as illustrated in FIG. 10, only the cured portion 21 remains on the first and second transparent substrates 10 and 50, such that the bezel portion 30 and the first electrode portion 40 and the second electrode portion 60 may be formed.

However, the present invention is not limited thereto, and therefore, as another example, at the time of performing the exposure using the photomask 20, only the portion to which light is not irradiated is cured, such that the bezel portion 30 and the first and second electrode portions 40 and 60 may be formed. Further, as another example, the preferred embodiment of the present invention exposes and cures the portion at which the bezel portion 30 and the first and second electrode portions 40 and 60 are formed, in the silver salt emulsion layer 20 by using the photomask and may conduct current only to the portion at which the first and second electrode portions 40 and 60 are formed, in the portion cured by fixatives. In this case, the non-cured portion may not be removed.

Meanwhile, the bezel portion 30 formed by exposing and developing the silver salt emulsion layer 20 is formed in the non-active regions 12 and 52 on the surfaces of the first and second transparent substrates 10 and 50, the first electrode portion 40 is formed on the other surface of the first transparent substrate 10, and the second electrode portion 60 is formed on one surface or the other surface of the second transparent substrate 50.

In this case, the first electrode portion 40 may include the first electrode 41 that is formed in the active regions 11 and 51 on the other surface of the first transparent substrate 10 and the first electrode wiring 42 that is formed in the inactive regions 12 and 52 thereof. Further, the second electrode portion 60 may include the second electrode 61 that is formed in the active regions 11 and 51 on the other surface of the second transparent substrate 50 and the second electrode wiring 62 that is formed in the inactive regions 12 and 52 thereof.

Further, the first and second electrode wirings 42 and 62 may be connected with edges of the first and second electrodes 41 and 61 to receive electrical signals from the first and second electrodes 41 and 61.

Figure 11:
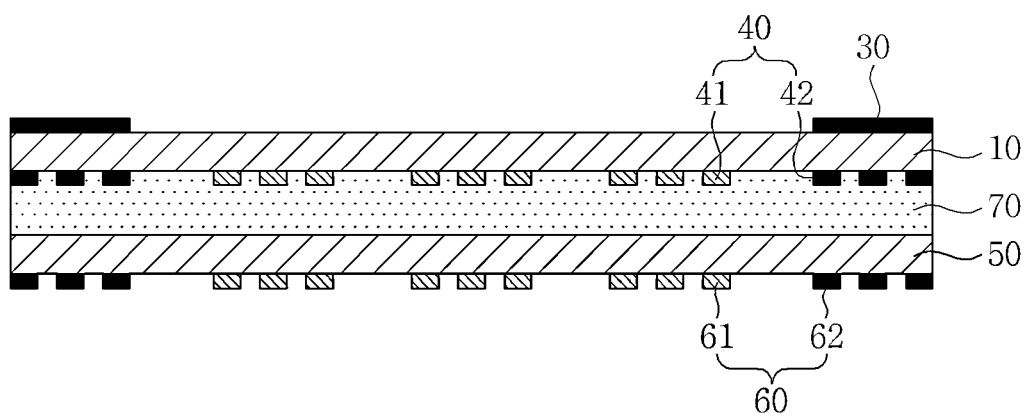

Meanwhile, referring to FIG. 11, the method for manufacturing a touch panel according to another preferred embodiment of the present invention may further include (c) forming an insulating layer 70 between the first transparent substrate 10 and the second transparent substrate 50.

Herein, the insulating layer 70 may be formed of epoxy or acrylic based resin, a SiOx thin film, a SiNx thin film, and the like, by printing, chemical vapor deposition (CVD), sputtering, and the like.

In this case, the window glass may be disposed at the outermost side of the touch panel. In this case, the window glass may be bonded to one surface of the first transparent substrate 10 by an adhesive, but the method for bonding the window glass of the present invention to the first transparent substrate 10 is not necessarily limited thereto.

Figure 12:
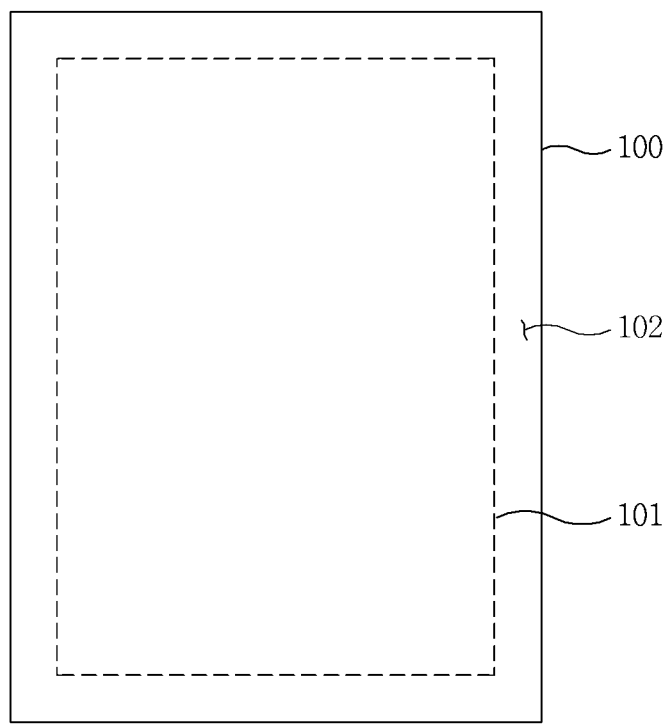
FIG. 12 is a plan view illustrating a transparent substrate included in a touch panel according to still another preferred embodiment of the present invention.
Figure 13:
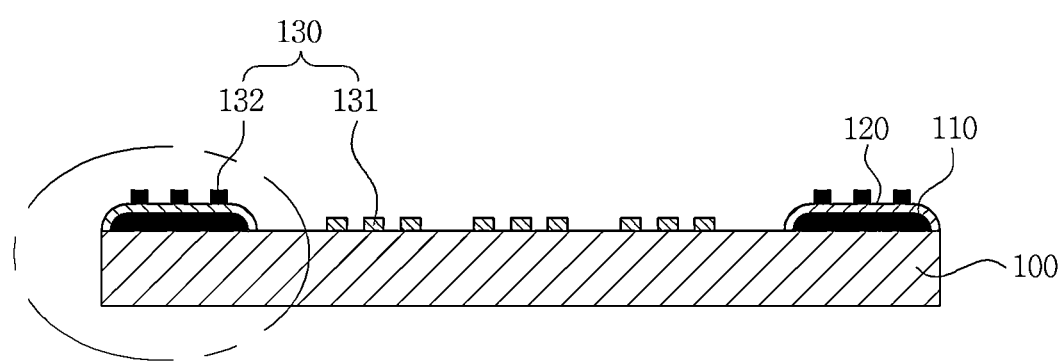
FIG. 13 is a cross-sectional view of the touch panel according to still another preferred embodiment of the present invention.
Figure 14:
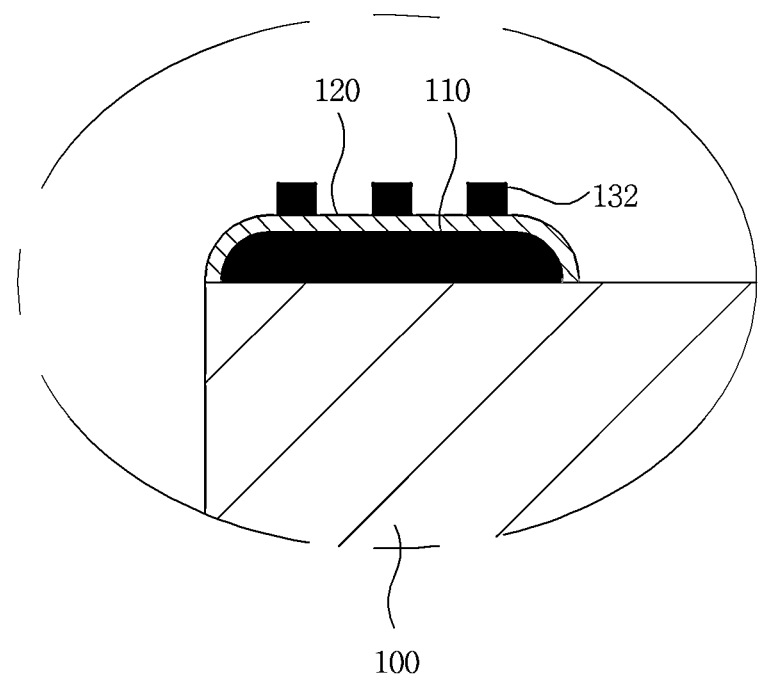
FIG. 14 is an enlarged cross-sectional view of region A shown in FIG. 13.

FIG. 12 is a plan view illustrating a transparent substrate included in a touch panel according to still another preferred embodiment of the present invention, FIG. 13 is a cross-sectional view of the touch panel according to still another preferred embodiment of the present invention, and FIG. 14 is an enlarged cross-sectional view of region A shown in FIG. 13.

Hereinafter, another preferred embodiment of the present invention will be described in detail with reference to FIGS. 12 to 14.

As illustrated in FIGS. 12 to 14, the touch panel according to the preferred embodiment of the present invention includes a transparent substrate 100 that is partitioned into an active region 101 and an inactive region 102 that is an edge of the active region 101, a bezel portion 110 that is formed in the inactive region 102 on one surface of the transparent substrate 100, and an electrode portion 130 that is formed in the inactive region on one surface of the bezel portion 110 and on one surface of the transparent substrate 100.

The transparent substrate 100 may serve to provide a region in which an electrode portion 130 for detecting touched positions is formed. The transparent substrate 100 needs to have support force capable of supporting the electrode portion 130 and transparency to allow a user to recognize images provided from an image display device.

In consideration of the support force and the transparency described above, the transparent substrate 100 may be made of polyethylene terephthalate (PET), polycarbonate (PC), poly methyl methacrylate (PMMA), polyethylene naphthalate (PEN), polyethersulpon (PES), a cyclic olefin polymer (COC), a triacetylcellulose (TAC) film, a polyvinyl alcohol (PVA) film, a polyimide (PI) film, polystyrene (PS), biaxially oriented polystyrene (BOPS; containing K resin), glass, or tempered glass, but is not necessarily limited thereto.

The transparent substrate 100 may be a window glass that is provided at an outermost side of the touch panel. When the transparent substrate 100 is a window glass, the electrode portion 130 may be directly formed on the window glass. Therefore, in the process of manufacturing a touch panel, a process of forming the electrode portion 130 on the separate transparent substrate 100 and attaching the electrode portion 130 to the window glass may be omitted, such that the overall thickness of the touch panel can be reduced.

Meanwhile, as illustrated in FIG. 12, the transparent substrate 100 may be partitioned into the active region 101 and the inactive region 102 that is the edge region of the active region 101. The active region 101 is a region that is touched by a user and a screen region in which a user visually identifies an operating scene of a device. Further, the inactive region 102 is covered by the bezel portion 110 to be described below that is formed on the transparent substrate 100, and thus is a region that is not exposed to the outside.

As shown in FIG. 13, the bezel portion 110 is formed in the inactive region 102 on one surface of the transparent substrate 100. The bezel portion 110 may serve to cover an electrode wiring 132 that is disposed in the region corresponding to the inactive region 102 of the transparent substrate 100. Further, the bezel portion 110 may be formed with an ornament pattern such as logos of makers, if necessary.

The electrode portion 130 may be formed on one surface of the transparent substrate 100. In this case, the electrode portion 130 may be configured to include an electrode 131 that is formed in the active region 101 on one surface of the transparent substrate 100 and an electrode wiring 132 that is formed on one surface of the bezel portion 110 that is the non-active region 102 and is connected with an edge of the electrode 131.

Herein, the electrode portion 130 including the electrode 131 and the electrode wiring 132 may be formed of the same material as the bezel portion 110. Therefore, the bezel portion 110 and the electrode portion 130 may be formed simultaneously, thereby simplifying the manufacturing process and shortening the manufacturing time.

The bezel portion 110 and the electrode portion 130 included in the touch panel according to the preferred embodiment of the present invention are formed by exposing and developing the silver salt emulsion layer.

The silver salt emulsion layer includes a silver salt and a binder and may further include additives such as a solvent, a dye, and the like.

An example of the silver salt may include an inorganic silver salt such as silver halide, and the like, or an organic silver salt such as acetate silver.

An example of the binder may include gelatin, polyvinyl alcohol (PVA), polyvinyl pyrrolidone (PVP), polysaccharides, such as starch, cellulose and derivatives thereof, polyethylene oxide, polyvinylamine, chitosan, poly-lysine, polyacrylic acid, poly-alginic acid, poly hyaluronic acid, carboxycellulose, and the like.

The solvent is not particularly limited, but may include, for example, water, organic solvents (for example, alcohols such as methanol, ketones such as acetone, amids such as formamid, sulfoxides such as dimethyl sulfoxide, esters such as acetic acid ethyl, ethers, and the like), an ionic liquid, and a mixed solvent thereof.

In addition, additives are not particularly limited, but known additives may be preferably used.

The bezel portion 110 and the electrode portion 130 formed by exposing and developing the silver salt emulsion layer 20 generally have a dark color as the silver particles generated by exposing and developing the silver salt emulsion layer have a black color or a dark color approximating a black color. Therefore, the silver salt emulsion layer may serve as a color ink layer that is formed as the bezel portion of the touch panel of the prior art.

As illustrated in FIG. 14, the bezel portion 110 formed by applying the silver salt emulsion layer on one surface of the transparent substrate 100 and exposing and developing it has a smoothly inclined surface formed at both sides in a width direction of the bezel portion 110.

The active region 101 on one surface of the transparent substrate 100 of the touch panel according to the preferred embodiment of the present invention may be formed with the bezel portion 110 and the electrode 131 of the electrode portion 130 that are described above.

In this case, in the touch panel according to the preferred embodiment of the present invention, as described above, both sides in a width direction of the bezel portion 110 has a smoothly inclined surface, such that the adhesion of the electrode portion 130 coated on the entire surface of the transparent substrate 100 is excellent. Therefore, in the touch panel according to the preferred embodiment of the present invention, the disconnection badness of the patterned electrode portion 130 does not occur.

In addition to the foregoing components, the touch panel according to the preferred embodiment of the present invention may further include an overcoat layer 120.

The overcoating layer 120, which is formed on the transparent substrate 100 to cover the bezel portion 110, may serve to protect the bezel portion 110 from external environments.

As illustrated in FIG. 13, the overcoat layer 120 may be formed to cover only the bezel portion 110. Alternatively, the overcoat layer 120 may be formed to cover the entire surface of the transparent substrate 100 including the bezel portion 110.

As the overcoat layer 120 is stacked in the bezel portion 110, both sides in the width direction of the overcoat layer 120 are formed to have a smoothly inclined surface corresponding to the smoothly inclined surface of both sides in a width direction of the bezel portion 110. Therefore, even when the preferred embodiment of the present invention further includes the overcoat layer 120, the adhesion of the electrode portion 130 or the adhesive property of the adhesive layer is good.

Meanwhile, the bezel portion 110 formed by exposing/developing the silver salt emulsion layer includes metal silver, and therefore may have electrical conductivity. In this case, as described above, when the electrode portion 130 is directly formed on one surface of the transparent substrate 100 and the electrode wiring 131 of the electrode portion 130 is disposed at a position corresponding to the inactive region 102 of the transparent substrate 100, there may be a problem in that a short occurs within the electrode portion 130 or between the electrode wirings 131 due to the electrical connection between the bezel portion 110 and the electrode portion 130 or between the bezel portion 110 and the electrode wiring 131.

Therefore, the overcoat layer 120 may be formed of an insulating material so as to prevent the short. The overcoat layer 120 may be formed of an organic resin insulating material, for example, acrylic, polyimide, and the like, or an inorganic insulating material, for example, oxide silicon, nitride silicon, nitrogen containing oxide silicon, oxygen containing nitride silicon, and the like.

According to the preferred embodiments of the present invention, it is possible to uniformly form the bezel portion by forming the bezel portion using the silver salt.

Further, according to the preferred embodiments of the present invention, it is possible to simplify the manufacturing process and shorten the manufacturing time by simultaneously forming the bezel portion and the electrode portion using the silver salt.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A touch panel, comprising:
    a first transparent substrate;
    a bezel portion formed on one surface of the first transparent substrate; and
    an electrode portion formed on the other surface of the first transparent substrate,
    wherein the bezel portion and the electrode portion are formed by exposing/developing a silver salt emulsion layer.

2. The touch panel as set forth in claim 1, wherein the first transparent substrate is formed of glass or film.

3. The touch panel as set forth in claim 1, wherein the first transparent substrate is partitioned into an active region and an inactive region that is an edge of the active region, and the bezel portion is formed in the inactive region on one surface of the first transparent substrate.

4. The touch panel as set forth in claim 3, wherein the first electrode portion includes:
    a first electrode formed in the active region on the other surface of the first transparent substrate; and
    a first electrode wiring formed in the inactive region on the other surface of the first transparent substrate so as to be connected with the electrode.

5. The touch panel as set forth in claim 1, wherein a silver salt included in the silver salt emulsion layer is an inorganic silver salt or an organic silver salt.

6. The touch panel as set forth in claim 1, further comprising:
    a second transparent substrate disposed in the other surface direction of the first transparent substrate; and
    a second electrode portion formed on one surface or the other surface of the second transparent substrate.

7. The touch panel as set forth in claim 6, further comprising:
    an insulating layer formed between the first transparent substrate and the second transparent substrate.

8. The touch panel as set forth in claim 6, wherein the second transparent substrate is partitioned into an active region and an inactive region that is an edge of the active region, and the second electrode portion includes:
    a second electrode formed in the active region on one surface or the other surface of the second transparent substrate; and
    a second electrode wiring formed in the inactive region on one surface or the other surface of the second transparent substrate so as to be connected with the electrode.

9. A method for manufacturing a touch panel, comprising:
    (a) applying a silver salt emulsion layer on both surfaces of a first transparent substrate; and
    (b) exposing/developing the silver salt emulsion layer to form a bezel portion on one surface of the first transparent substrate and form a first electrode portion on the other surface thereof.

10. The method as set forth in claim 9, wherein in the step (b), the first transparent substrate is partitioned into an active region and an inactive region that is an edge of the active region to form the bezel portion in the inactive region on one surface of the first transparent substrate.

11. The method as set forth in claim 10, wherein in the step (b), the first electrode portion includes a first electrode and a first electrode wiring to form the first electrode in the active region on the other surface of the first transparent substrate and the first electrode wiring in the inactive region so as to be connected with the first electrode.

12. The method as set forth in claim 9, wherein in the step (b), the bezel portion and the first electrode portion are formed simultaneously.

13. The method as set forth in claim 9, wherein the step (a) includes applying the silver salt emulsion layer on one surface or the other surface of the second transparent substrate.

14. The method as set forth in claim 13, wherein the step (b) includes exposing/developing the sliver salt emulsion layer to form a second electrode portion on one surface or the other surface of the second transparent substrate.

15. The method as set forth in claim 14, wherein in the step (b), the bezel portion and the first and second electrode portions are formed simultaneously.

16. The method as set forth in claim 14, wherein in the step (b), the second electrode portion includes a second electrode and a second electrode wiring, and
    the second transparent substrate is partitioned into an active region and an inactive region that is an edge of the active region to form the second electrode in the active region on one surface or the other surface of the second transparent substrate and form the second electrode wiring in the inactive region so as to be connected with the second electrode.

17. The method as set forth in claim 13, wherein the first and second transparent substrates are formed of glass or film.

18. The method as set forth in claim 13, wherein a silver salt included in the silver salt emulsion layer is an inorganic silver salt or an organic silver salt.

19. A touch panel, comprising:
    a transparent substrate that is partitioned into an active region and an inactive region that is an edge of the active region;
    a bezel portion formed in the inactive region on one surface of the transparent substrate; and
    an electrode portion that is formed in the inactive region on one surface of the bezel portion and one surface of the transparent substrate,
    wherein the bezel portion and the electrode portion are formed by exposing/developing a silver salt emulsion layer.

20. The touch panel as set forth in claim 19, further comprising:
    an overcoat layer disposed between the bezel portion and the electrode portion to cover the bezel portion.

* * * * *